United States Patent
Borthakur et al.

(10) Patent No.: US 9,041,840 B2
(45) Date of Patent: May 26, 2015

(54) BACKSIDE ILLUMINATED IMAGE SENSORS WITH STACKED DIES

(71) Applicant: Semiconductor Components Industries, LLC, Phoenix, AZ (US)

(72) Inventors: Swarnal Borthakur, Boise, ID (US); Scott Churchwell, Boise, ID (US); Ulrich Boettiger, Garden City, ID (US); Marc Sulfridge, Boise, ID (US); Andrew Perkins, Boise, ID (US); Rick Lake, Meridian, ID (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 99 days.

(21) Appl. No.: 13/972,249

(22) Filed: Aug. 21, 2013

(65) Prior Publication Data

US 2014/0055654 A1   Feb. 27, 2014

Related U.S. Application Data

(60) Provisional application No. 61/691,726, filed on Aug. 21, 2012, provisional application No. 61/692,186, filed on Aug. 22, 2012.

(51) Int. Cl.
*H04N 5/335*  (2011.01)
*H04N 5/225*  (2006.01)
*H01L 27/146*  (2006.01)

(52) U.S. Cl.
CPC ............. *H04N 5/335* (2013.01); *H04N 5/2253* (2013.01); *H04N 5/2254* (2013.01); *H01L 27/14612* (2013.01); *H01L 27/14616* (2013.01); *H01L 27/14641* (2013.01)

(58) Field of Classification Search
CPC .. H04N 5/2251; H04N 5/335; H04N 1/00978
USPC ................................. 348/302; 257/751, 723
See application file for complete search history.

(56) References Cited

U.S. PATENT DOCUMENTS

| | | | |
|---|---|---|---|
| 4,706,553 A | 11/1987 | Sharp et al. |
| 6,933,617 B2 | 8/2005 | Pierce |
| 7,042,077 B2 | 5/2006 | Walk et al. |
| 7,122,458 B2 | 10/2006 | Cheng et al. |
| 7,592,202 B2 | 9/2009 | Toyama et al. |
| 7,646,087 B2 | 1/2010 | Tu et al. |
| 7,663,231 B2 | 2/2010 | Chang et al. |
| 2008/0308928 A1 | 12/2008 | Chang et al. |
| 2009/0315180 A1 | 12/2009 | Lee |
| 2012/0194719 A1 | 8/2012 | Churchwell et al. |

*Primary Examiner* — Twyler Haskins
*Assistant Examiner* — Padma Haliyur
(74) *Attorney, Agent, or Firm* — Treyz Law Group; Kendall P. Woodruff

(57) ABSTRACT

An image sensor unit may have a backside-illuminated imager and an image co-processor stacked together. The image co-processor may be mounted in a cavity in a permanent carrier. The permanent carrier may include fluid channels that allow cooling fluid to flow past the image co-process and past the imager, thereby removing excess heat generated by the image sensor unit during operation.

17 Claims, 10 Drawing Sheets

BACKSIDE ILLUMINATED IMAGE SENSORS WITH STACKED DIES

This application claims the benefit of provisional patent application No. 61/691,726, filed Aug. 21, 2012 and claims the benefit of provisional patent application No. 61/692,186, filed Aug. 22, 2012, each of which is hereby incorporated by reference herein in its entirety.

BACKGROUND

The present invention relates to imaging devices, and, more particularly, to image sensor units formed using stacked image sensor and processor integrated circuits.

Image sensors are commonly used in electronic devices such as cellular telephones, cameras, and computers to capture images. In a typical arrangement, an electronic device is provided with an image sensor integrated circuit that contains control circuitry for controlling an associated image sensor pixel array. The control circuitry includes row driver circuits for generating control signals such as row select signals. The control signals also include column readout circuitry that converts analog image data signals from data lines in the image sensor pixel array into digital image data. Image processing tasks can sometimes be at least partly performed using image-processing circuits in the image processor integrated circuit. In many situations, however, use of a processor integrated circuit that is separate from the sensor integrated circuit is desirable. For example, separate image processing chips may be used to handle input-output functions and image processing functions that require more processing power than is available on an image sensor integrated circuit.

In many image sensor applications, space is limited. It may also be desirable to minimize the number of integrated circuit components that are used in a given device (e.g., to reduce part count and assembly costs). As a result, image processing chips are sometimes stacked together with an image sensor integrated circuit. The resulting stacked arrangements are susceptible to overheating and may be undesirably tall (i.e., thick).

It would be desirable to be able to provide improved image sensors with stacked dies.

DETAILED DESCRIPTION

Figure 1:
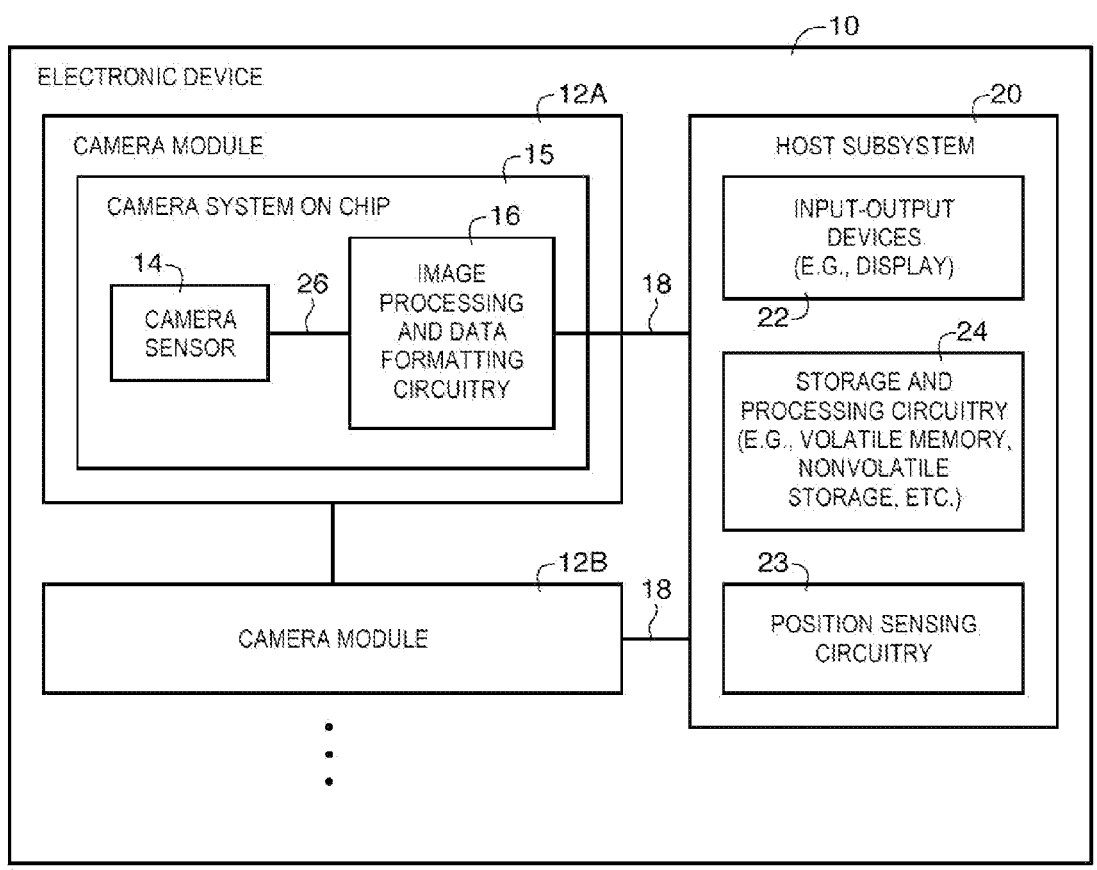
FIG. 1 is a diagram of an electronic device and computing equipment that may include a backside illuminated image sensor having stacked dies in accordance with embodiments of the present invention.

Digital camera modules are widely used in electronic devices. An electronic device with a digital camera module is shown in FIG. 1. Electronic device 10 may be a digital camera, a laptop computer, a display, a computer, a cellular telephone, or other electronic device. Device 10 may include one or more imaging systems such as imaging systems 12A and 12B (e.g., camera modules 12A and 12B) each of which may include one or more image sensors 14 and corresponding lenses. During operation, a lens focuses light onto an image sensor 14. The lens may have fixed aperture. The pixels in image sensor 14 include photosensitive elements that convert the light into digital data. Image sensors may have any number of pixels (e.g., hundreds or thousands or more). A typical image sensor may, for example, have millions of pixels (e.g., megapixels). In high-end equipment, sensors with 10 megapixels or more are not uncommon. In at least some arrangements, device 10 may include two (or more) image sensors 14, which may capture images from different perspectives. When device 10 includes two image sensors 14, device 14 may be able to capture stereo images.

Still and video image data from camera sensor 14 may be provided to image processing and data formatting circuitry 16 via path 26. Image processing and data formatting circuitry 16 may be used to perform image processing functions such as adjusting white balance and exposure and implementing video image stabilization, image cropping, image scaling, etc. Image processing and data formatting circuitry 16 may also be used to compress raw camera image files if desired (e.g., to Joint Photographic Experts Group or JPEG format).

In some arrangements, which is sometimes referred to as a system on chip or SOC arrangement, camera sensor 14 and image processing and data formatting circuitry 16 are implemented as a common unit 15 (e.g., on a common integrated circuit, or stacked together). The use of a single integrated circuit to implement camera sensor 14 and image processing and data formatting circuitry 16 can help to minimize costs. If desired, however, multiple integrated circuits may be used to implement circuitry 15. In arrangements in which device 10 includes multiple camera sensors 14, each camera sensor 14 and associated image processing and data formatting circuitry 16 can be formed on a separate SOC integrated circuit (e.g., there may be multiple camera system on chip modules such as modules 12A and 12B).

To save space and simplify assembly by a manufacturer of a camera or other electronic device in which imaging capabilities are desired, it may be desirable to stack a processor (e.g., processing circuitry 16, or a processor in camera sensor 14) and an imager (e.g., camera sensor 14) to form a preassembled image sensor unit 15. An image sensor unit 15 that is formed in this way has the image sensing capabilities of the imager and the processing capabilities of the processor in a single component. Additionally, in arrangements in which the processor 16 (sometimes referred to herein as an image co-processor iCP) has a smaller area than the imager 14, forming the processor 16 on a separate wafer may decrease the cost of the processor 16, by allowing more processors 16 to be formed on each wafer. Moreover, processors 16 and imagers 14 may be formed on different types of wafers, each of which may be optimized for their respective use. As an example, a wafer of image co-processors 16 may be optimized for analog circuitry (to optimize the performance of analog circuitry in the image co-processors such as sample and hold circuitry, line buffers, and analog-to-digital converters) or digital circuitry (to optimize the performance of digital circuitry in the image co-processors such as image formatting circuitry). Meanwhile, the imager wafer may be optimized for optical performance. Optimization of wafers for analog, digital, and/or optical performance may involve altering the materials and methods used in forming completed wafers and the design and arrangement of circuits in the wafers, as examples.

Circuitry 15 conveys data to host subsystem 20 over path 18. Circuitry 15 may provide acquired image data such as captured video and still digital images to host subsystem 20.

Electronic device 10 typically provides a user with numerous high level functions. In a computer or advanced cellular telephone, for example, a user may be provided with the ability to run user applications. To implement these functions, electronic device 10 may have input-output devices 22 such as projectors, keypads, input-output ports, and displays and storage and processing circuitry 24. Storage and processing circuitry 24 may include volatile and nonvolatile memory (e.g., random-access memory, flash memory, hard drives, solid state drives, etc.). Storage and processing circuitry 24 may also include processors such as microprocessors, microcontrollers, digital signal processors, application specific integrated circuits, etc.

Device 10 may include position sensing circuitry 23. Position sensing circuitry 23 may include, as examples, global positioning system (GPS) circuitry, radio-frequency-based positioning circuitry (e.g., cellular-telephone positioning circuitry), gyroscopes, accelerometers, compasses, magnetometers, etc.

Figure 2:
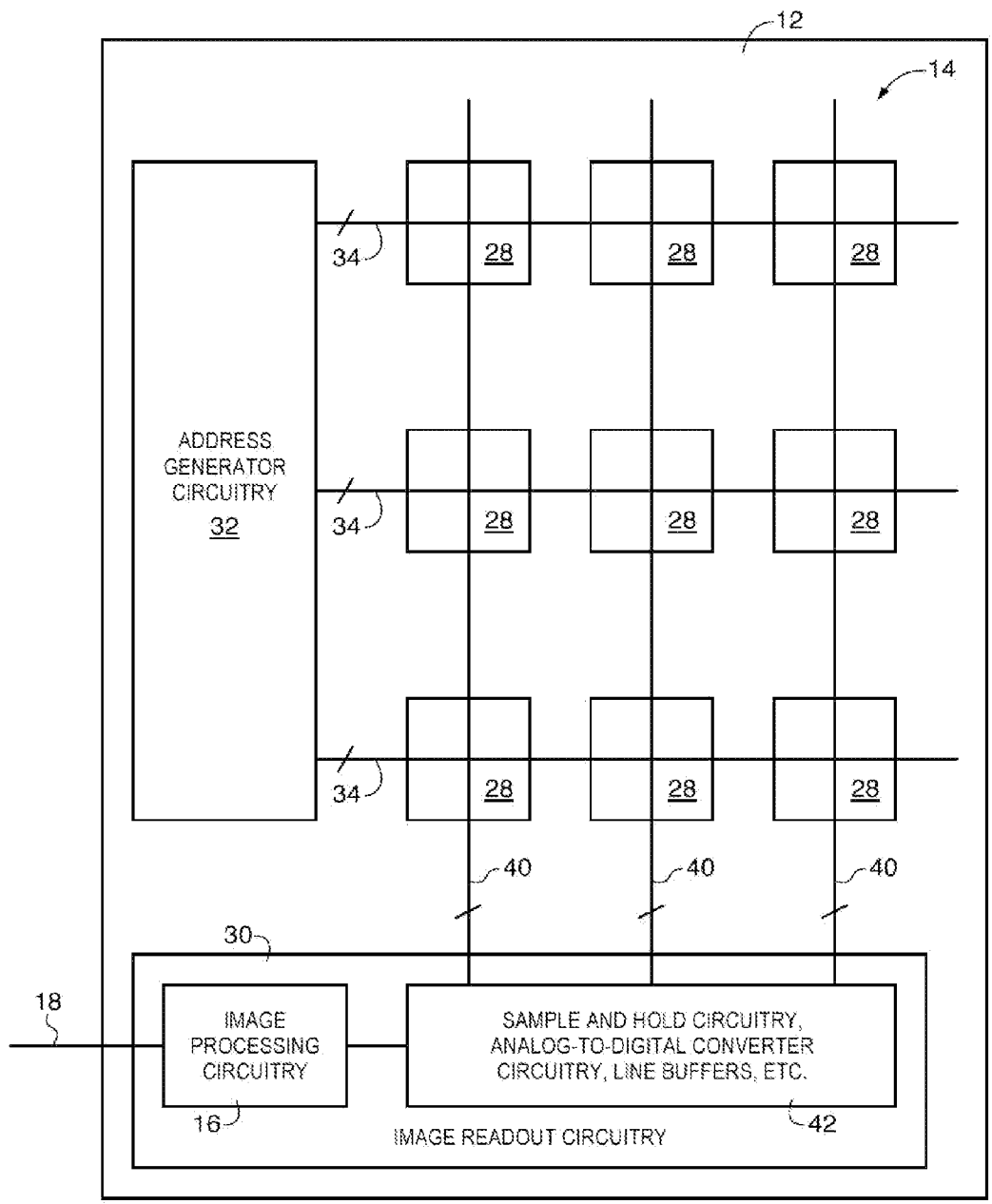
FIG. 2 is a diagram of an illustrative array of light-sensitive imaging pixels that may form an image sensor in the electronic device of FIG. 1 in accordance with embodiments of the present invention.

An example of an arrangement for sensor array 14 is shown in FIG. 2. As shown in FIG. 2, device 10 may include an array 14 of pixels 28 coupled to image readout circuitry 30 and address generator circuitry 32. As an example, each of the pixels in a row of array 14 may be coupled to address generator circuitry 32 by one or more conductive lines 34. Array 14 may have any number of rows and columns. In general, the size of array 14 and the number of rows and columns in array 14 will depend on the particular implementation. While rows and columns are generally described herein as being horizontal and vertical rows and columns may refer to any grid-like structure (e.g., features described herein as rows may be arranged vertically and features described herein as columns may be arranged horizontally).

Address generator circuitry 32 may generate signals on paths 34 as desired. For example, address generator circuitry 32 may generate reset signals on reset lines in paths 34, transfer signals on transfer lines in paths 34, and row select (e.g., row readout) signals on row select lines in paths 34 to control the operation of array 14. If desired, address generator circuitry 32 and array 14 may be integrated together in a single integrated circuit (as an example).

Image readout circuitry 30 may include circuitry 42 and image processing and data formatting circuitry 16. Circuitry 42 may include sample and hold circuitry, analog-to-digital converter circuitry, and line buffer circuitry (as examples). As one example, circuitry 42 may be used to measure signals in pixels 28 and may be used to buffer the signals while analog-to-digital converters in circuitry 42 convert the signals to digital signals. In a typical arrangement, circuitry 42 reads signals from rows of pixels 28 one row at a time over lines 40. With another suitable arrangement, circuitry 42 reads signals from groups of pixels 28 (e.g., groups formed from pixels located in multiple rows and columns of array 14) one group at a time over lines 40. The digital signals read out by circuitry 42 may be representative of charges accumulated by pixels 28 in response to incident light. The digital signals produced by the analog-to-digital converters of circuitry 42 may be conveyed to image processing and data formatting circuitry 16 and then to host subsystem 20 (FIG. 1) over path 18.

Figure 3:
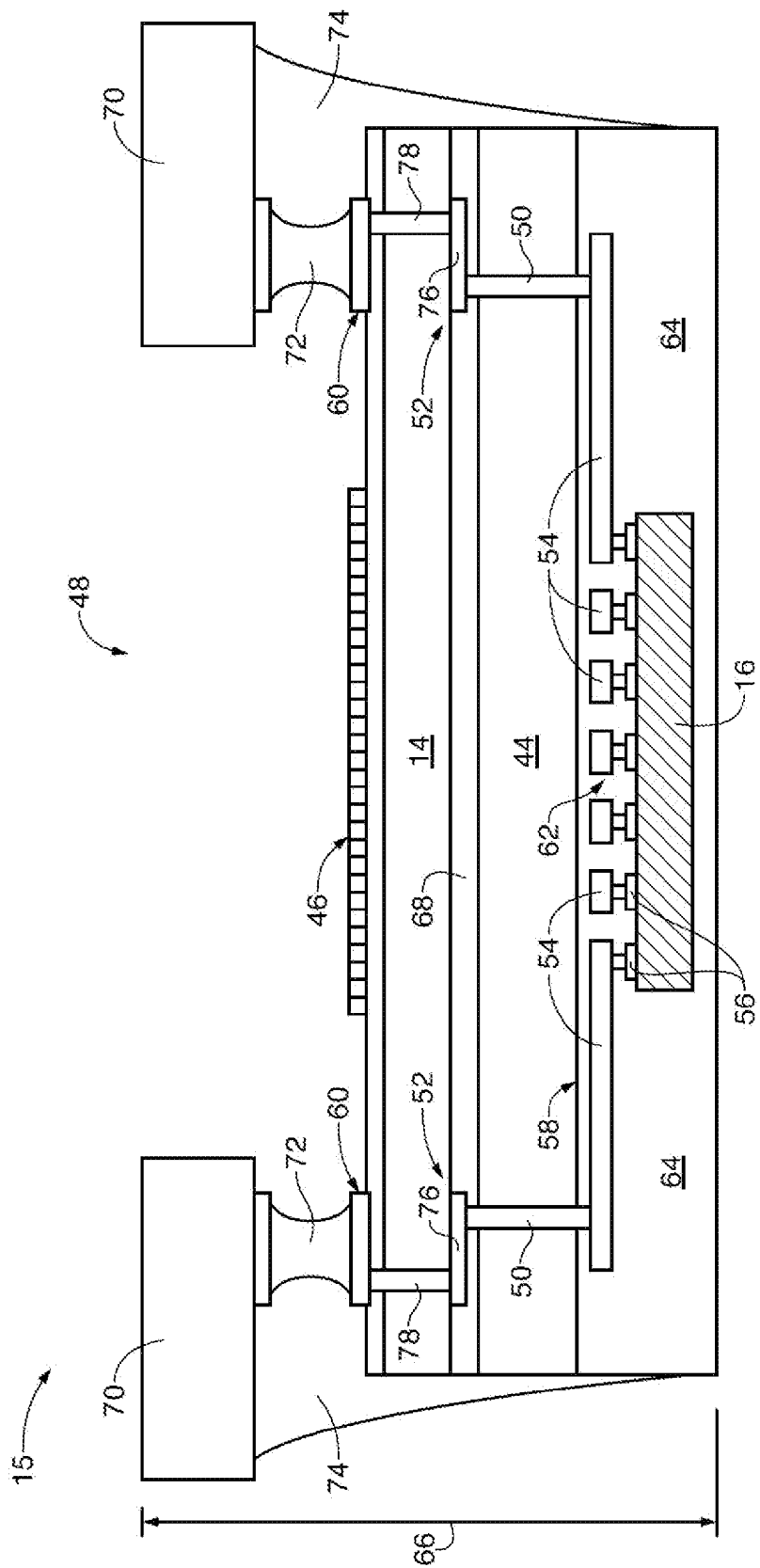
FIG. 3 is a cross-sectional side view of an illustrative image sensor that may include an image processor die coupled to an image carrier in accordance with embodiments of the present invention.

As shown in FIG. 3, image sensor 14 and image co-processor 16 may be stacked together. As an example, the frontside of image co-processor (iCP) 16 and the frontside of image sensor 14 may be bonded to carrier 44. Image sensor 14 may be bonded to carrier 44 by a layer such as oxide layer 68. In the arrangement of FIG. 3, image sensor 14 may be a backside illuminated image sensor 14 that receives light coming from direction 48, after being filtered by color-filter array 46 (which may itself include a microlens array). Active components in image sensor 14 may be located on the frontside of image sensor 14 (e.g., on the side adjacent to oxide layer 68). Signals may be routed between active components in image sensor 14, such as imaging pixels and image readout circuitry, and external circuitry through vias 78 and between the active components in image sensor 14 and iCP 16 through vias 50. The overall thickness 66 (or height) of the image sensor unit 15 may be on the order of 200 to 250 micrometers.

Carrier 41 may be a permanent silicon carrier. Carrier 44 may include a plurality of through vias 50 that couples frontside bond pads of the image sensor 14 to a redistribution layer (RDL) 54. The redistribution layer 54 may then couple the vias 50 to metal contacts 56 (e.g., frontside bond pads) in iCP 16. A passivation layer 58 may separate the redistribution layer 54 from the silicon of the carrier 44. An additional redistribution layer 76, which may be a part of oxide layer 68, may couple vias 50 to vias 78 in imager 14.

iCP 16 may include metal contacts 56. Some of the metal contacts 56 may be coupled to frontside bond pads 52 and thereby coupled to circuitry in imager 14. Still other metal contacts 56 in iCP 16 may be coupled to external circuitry through backside bond pads 60. At least a first subset of the backside bond pads 60 may be specific to iCP 16 and at least a second subset of the backside bond pads 60 may be specific to imager 14. If desired, some of the backside bond pads (such as bond pads providing common power supply voltages) may be shared by iCP 16 and imager 14.

iCP 16 may be bonded to carrier 44 through any desired and suitable means. As an example, a gold-gold bond, solder-solder bond, or a copper-copper bond may be utilized. If desired, underfill 62 may be added to increase the strength of the bond between iCP 16. Underfill 62 may provide electrical insulation and heat conduction or isolation, as desired. In addition, iCP 16 may be covered by overmold 64. Overmold 64, like underfill 62, may to provide structural support, electrical insulation, and heat conduction or isolation, as desired. Overmold 64 may also protect iCP 16 and other components from environmental damage and contamination (e.g., impacts and dirt).

Backside bond pads 72 may be coupled to interposer 70 through contacts 72. Contacts 72 may be formed from copper or any other desired conductive material. Adhesive 74 may help to hold interposer 70 to imager 14, carrier 44, and overmold 64. As an example, adhesive 74 may be epoxy.

Figure 4:
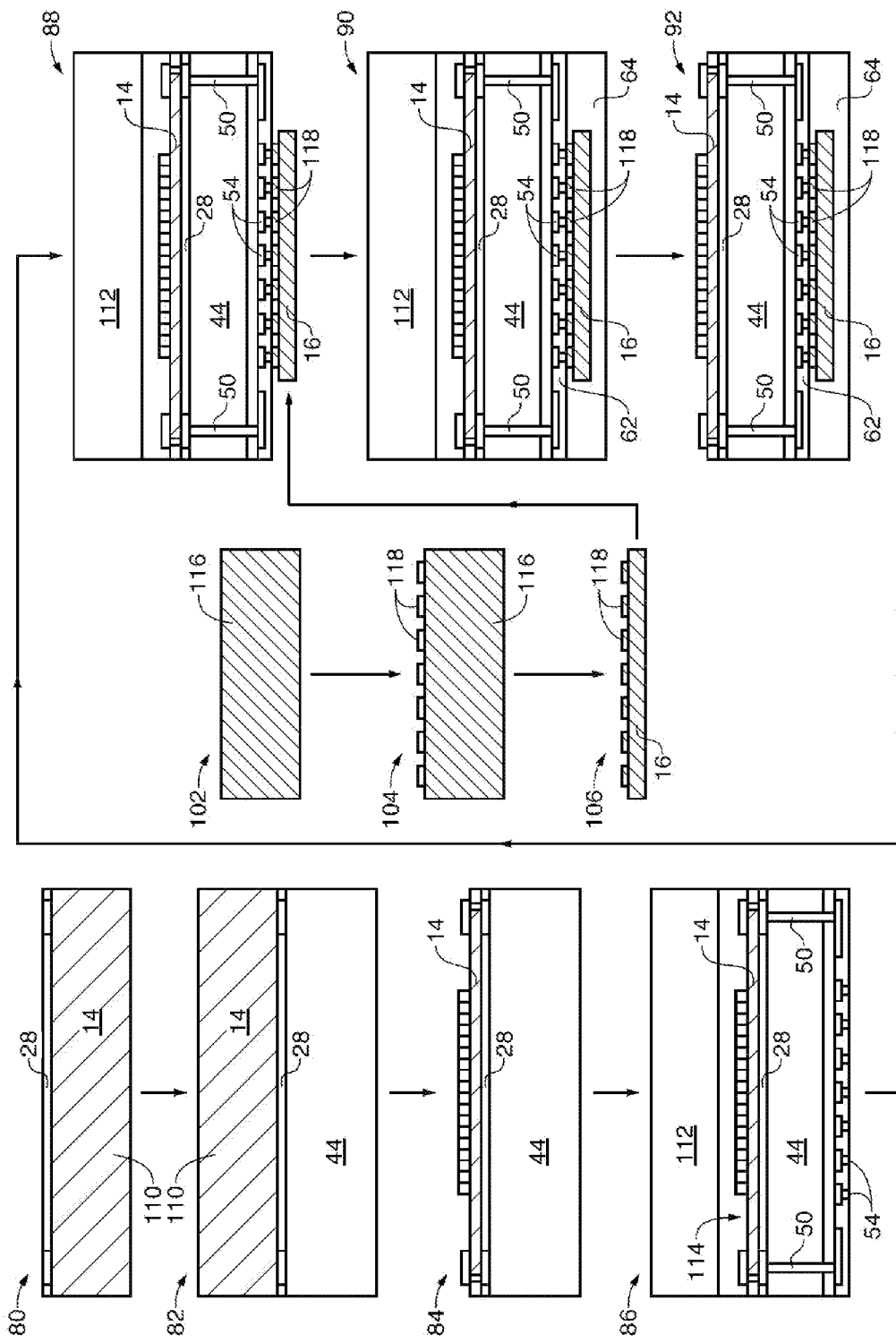
FIG. 4 illustrates an illustrative process flow that may be involved in forming the image sensor of FIG. 3 in accordance with embodiment of the present invention.

An illustrated process flow (e.g., a series of steps) involved in forming image sensor unit 15 of FIG. 3 is shown in FIG. 4.

In step 80, imager wafer 110, which includes a plurality of imagers 14 and their respective pixels 28, may be formed. Processes for forming imager wafer 110 have been omitted for the sake of brevity. As shown in the example of FIG. 4, imager wafer 110 may include a backside illuminated image sensors. If desired, the processes of FIG. 4 may be modified in order to form frontside illuminated imagers.

In step 82, imager wafer 110 may be flipped and bonded to a carrier 44. Imager wafer 110 and carrier 44 may be bonded together using any suitable and desired techniques. As an example and as discussed above in connection with FIG. 3, imager wafer 110 and the imagers 14 included therein may be bonded to carrier 44 using a layer of oxide.

In step 84, the backside of imager 110 may be processed. As an example, wafer 110 may be thinned and structures such as color-filter arrays 46 for each imager 14 may be formed on the backside of wafer 110.

In step 86, a temporary carrier such as carrier 112 may be bonded to imager wafer 110. Temporary carrier 112 may be bonded to imager wafer 110 using adhesive 114, as an example. In addition, through silicon vias 50 may be formed in carrier 44 and redistribution layer 54 may be formed on carrier 54, in step 86.

In step 102, a completed image co-processor wafer 116 may be obtained. Processes for forming iCP wafer 116 have been omitted for the sake of brevity.

In step 104, redistribution layers 118 may be formed on iCP wafer 116. Redistribution layers 118 may serve to interconnect metal contacts 56 in iCP 16 to redistribution layer 54, in the completed image sensor unit 15.

In step 106, iCP wafer 116 may be thinned and diced. In particular, individual iCPs 16 may be separated from wafer 116.

In step 88, individual iCPs 16 may be attached to respective imagers 14 on the combined imager wafer 110 and carrier 44 stack formed in preceding steps. Pick and place machinery may be used in attaching each individual iCP 16 to its respective imager 44.

In step 90, underfill 62 and overmold 64 may be added. As discussed above in connection with FIG. 3, underfill 62 and overmold 64 may provide strength, electrical isolation, environmental protection, and thermal isolation or coupling (as desired).

In step 92, temporary carrier 112 may be removed. If desired, step 92 may also include singulating individual image sensor units 15 (e.g., dicing the imager wafer 110 into individual imagers 44 and associated components).

Figure 5:
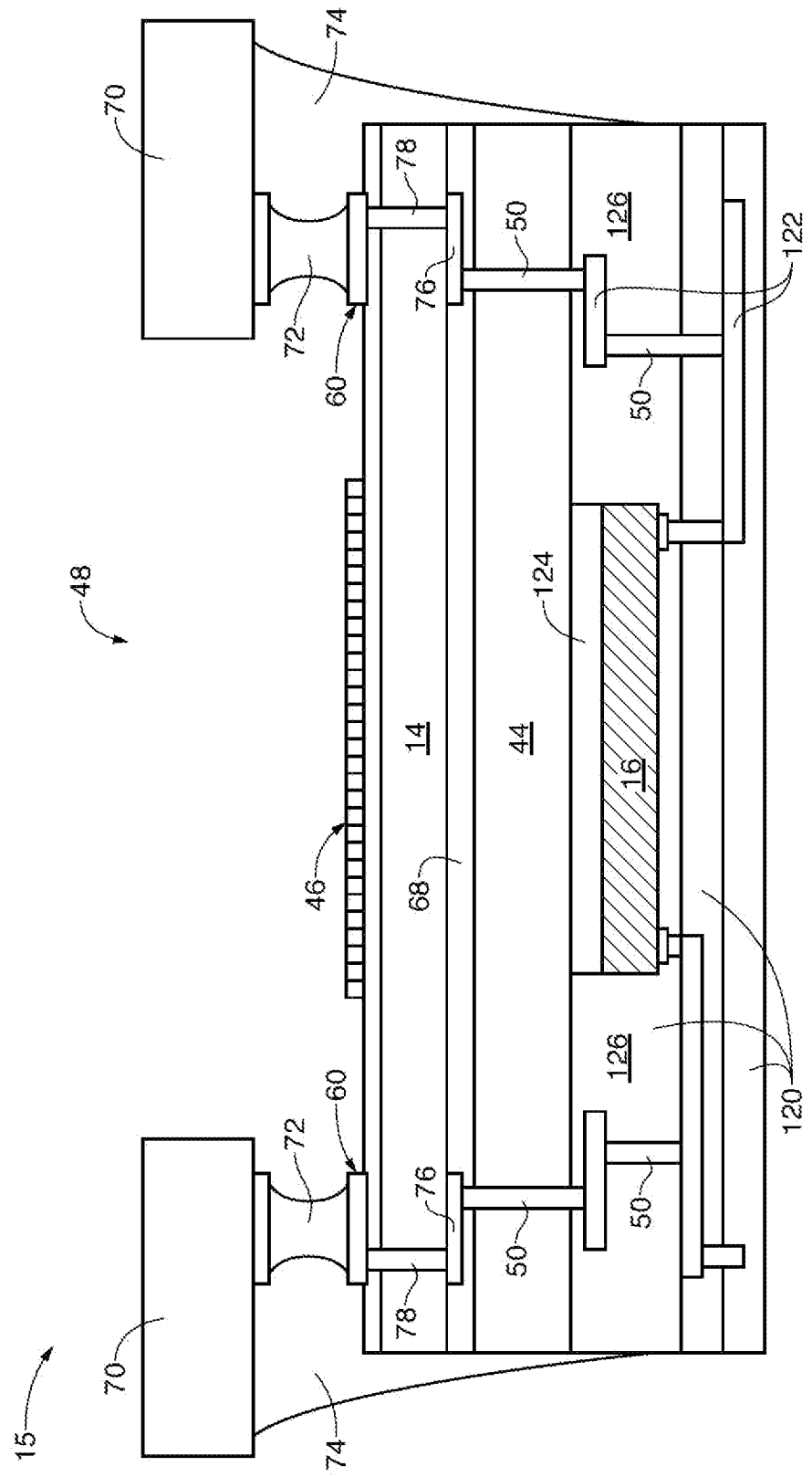
FIG. 5 is a cross-sectional side view illustrating a variation of the image sensor of FIG. 3 in which a backside of the image processor die is coupled to the image carrier in accordance with embodiments of the present invention.

As shown in FIG. 5, the backside of iCP 16 may be mounted to carrier 44. In this arrangement, the die of iCP 16 may be mounted to carrier 44, with an optional intervening passivation layer 124. iCP 16 may be mounted to carrier 44 using a die attach film (DAF), as one example.

After mounting iCP 16 to carrier 44, photodefinable layers 126 may be deposited to cover iCP 16. Additional redistribution layers 122 and through-silicon vias 50 may be formed in the photodefinable layers 126, in order to connect the frontside of iCP 16 to imager 14 and external circuitry. Passivation layers such as layers 120 may be included where appropriate and desired.

Figure 6:
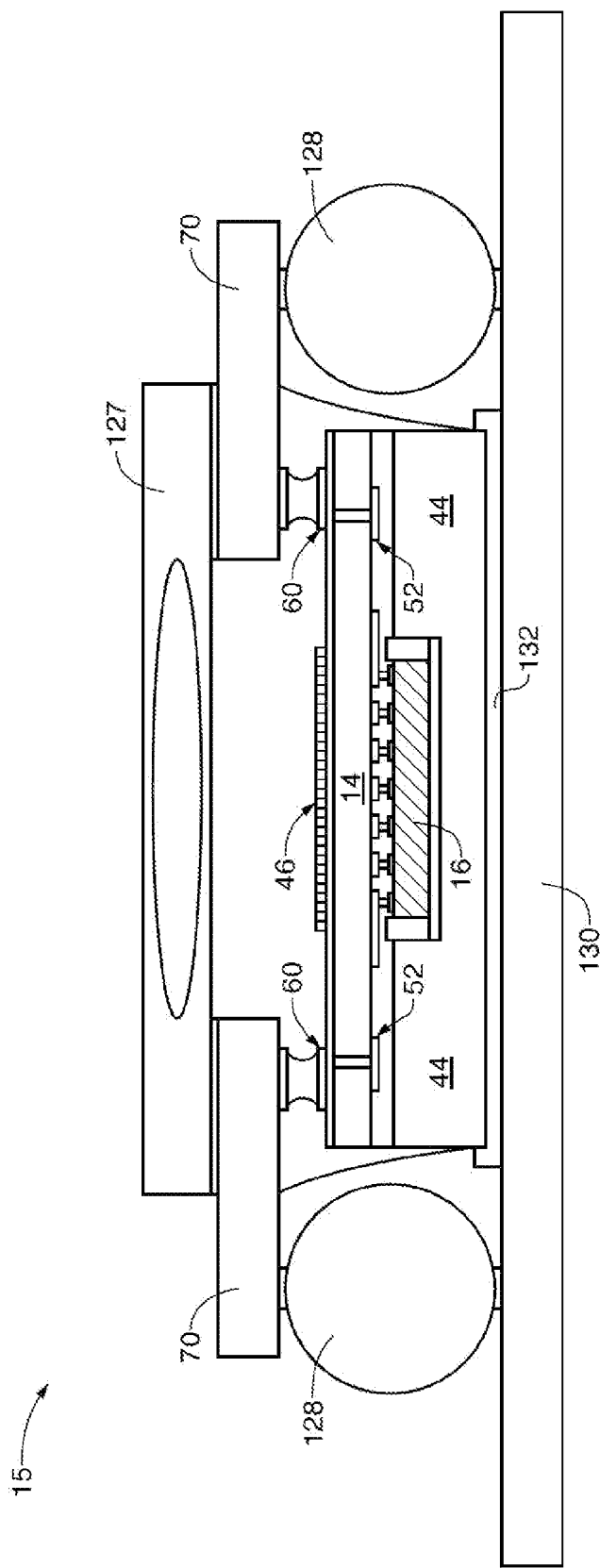
FIG. 6 is a cross-sectional side view of an illustrative image sensor that may include an image processor die embedded into an image carrier in accordance with embodiments of the present invention.

If desired, iCP 16 may be embedded into permanent carrier 44. An example of an arrangement of this type is shown in FIG. 6. As shown in FIG. 6, iCP 16 may optionally be embedded into a cavity formed in the permanent carrier 44. By forming iCP 44 in a cavity in carrier 44, the overall height of the image sensor unit 15 may be decreased.

As shown in FIG. 6, one or more lenses 127 may optionally be formed over imager 14. The lenses 127 may be suspended above imager 14 (e.g., above color-filter array 46) by interposer 70.

FIG. 6 also illustrates that the image sensor unit 15 (e.g., the stacked combination of carrier wafer 44, iCP 16, imager 14, and associated components) may be mounted to a printed circuit board such as PCB 130. Image sensor unit 15 (which may also be referred to as an image sensor module) may be mounted to PCB 130 by surface mount techniques such as solder reflow techniques. In other words, image sensor module 15 may be mounted to PCB 130 using solder 132 or adhesive, as desired. If desired, solder balls 128 may further couple the image sensor module 150 to PCB 130. Solder balls 128 may, in particular, couple interposer 70 directly to PCB 130.

Figure 7:
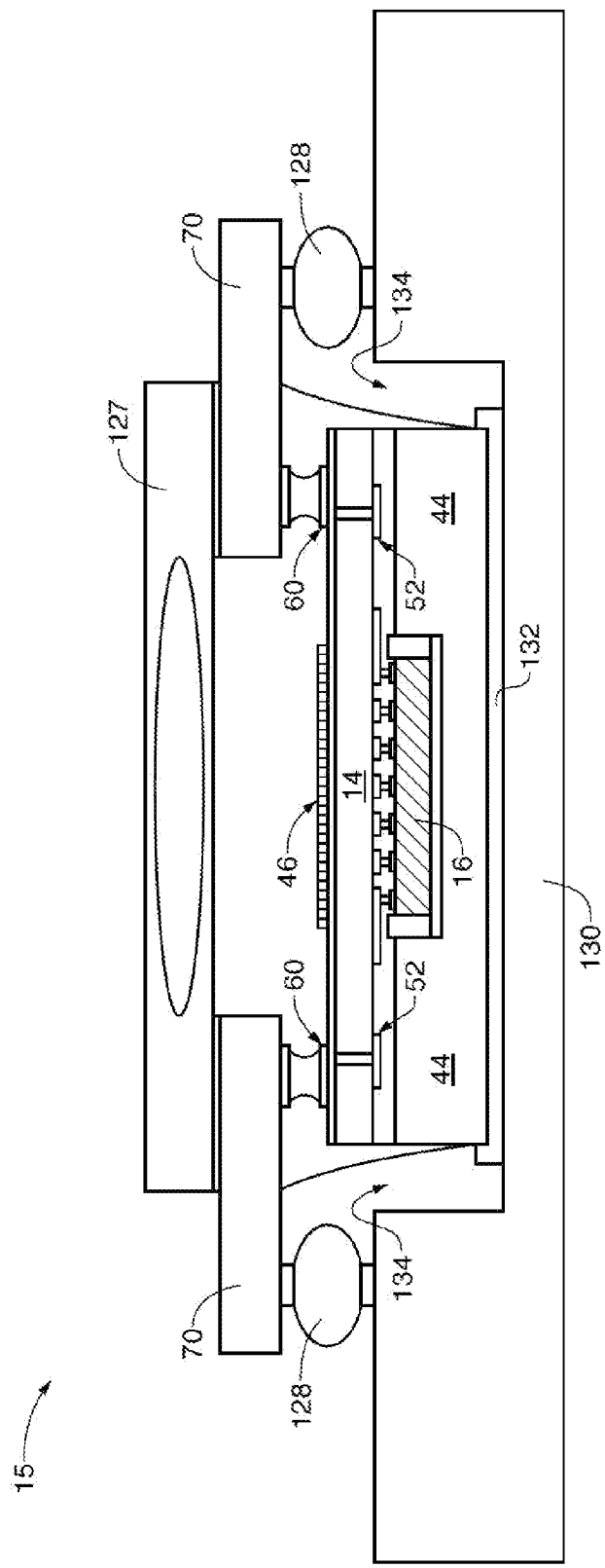
FIG. 7 is a cross-sectional side view illustrating a variation of the image sensor of FIG. 6 in which the image carrier may be recessed into a printed circuit board in a manner that reduces the overall thickness of the image sensor in accordance with embodiments of the present invention.

As shown in FIG. 7, printed circuit board 130 may include a recess into which permanent carrier 44 fits. By recessing permanent carrier 44 into PCB 130, the overall thickness of the image sensor unit 15 (together with PCB 130) may be reduced, relative to the arrangement of FIG. 6. Additionally, recessing carrier 44 into PCB 130 may provide additional mechanical rigidity and strength.

Figure 8A:
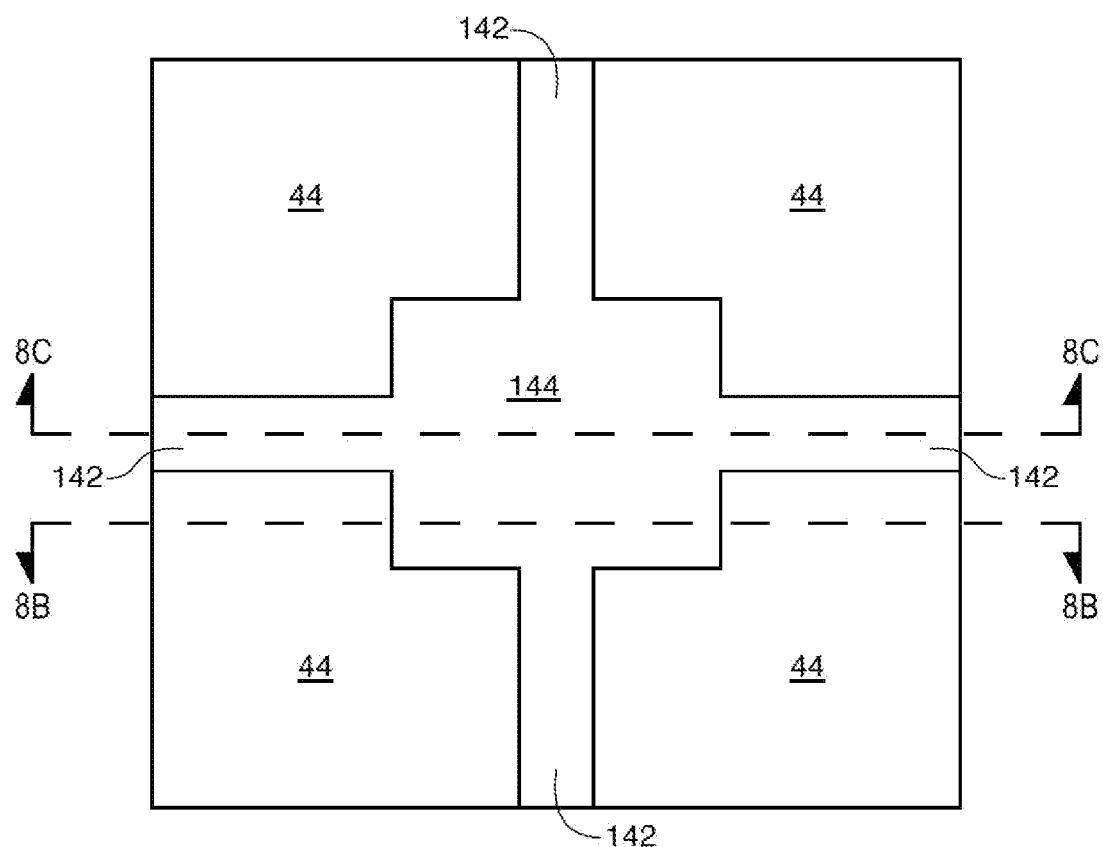
FIG. 8A is a top view of an illustrative carrier that may include a cavity into which an image co-processor may be mounted and that may include cooling channels in accordance with embodiments of the present invention.
Figure 8B:
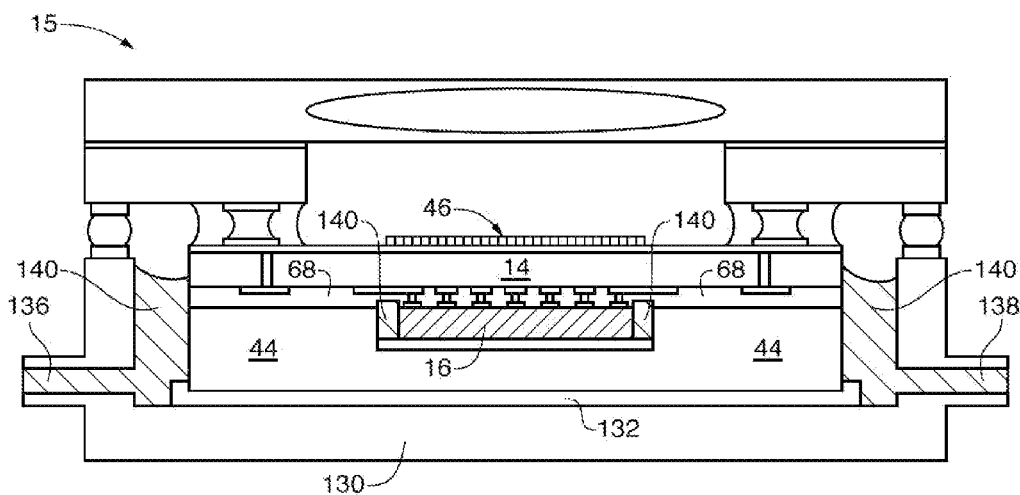
FIG. 8B is a cross-sectional side view of the illustrative carrier of FIG. 8A, taken along cross-sectional line 8B, and implemented in an image sensor such as the image sensor of FIG. 7 in accordance with embodiments of the present invention.
Figure 8C:
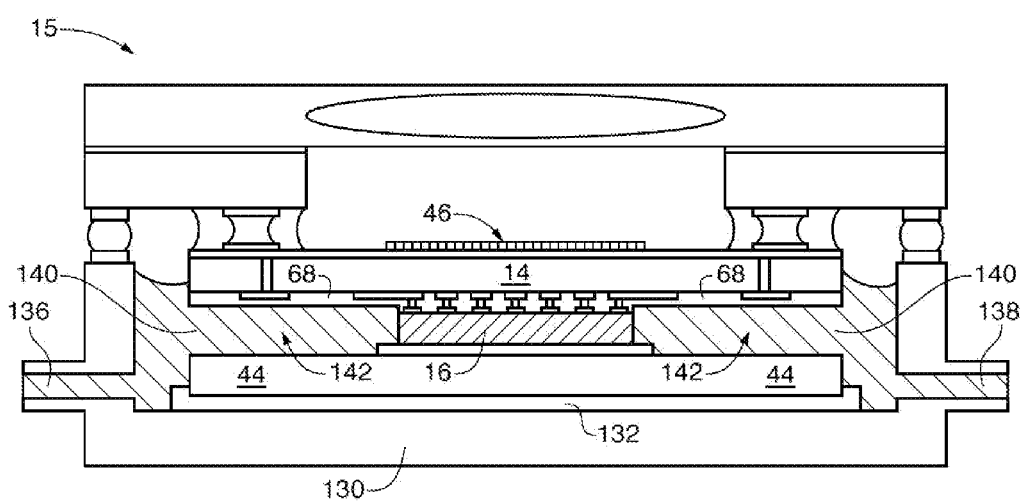
FIG. 8C is a cross-sectional side view of the illustrative carrier of FIG. 8A, taken along cross-sectional line 8C, and implemented in an image sensor such as the image sensor of FIG. 7 in accordance with embodiments of the present invention.

One issue that may arise when stacking iCP 16 together with imager 14 is insufficient heat dispersal. In particular, imager 14 and iCP 16 will generally each produce thermal energy during operation, and having these components in close proximity may lead to undesirably high levels of heating during operation. As a result, it may be desirable to provide a stacked arrangement with additional cooling. An example of such an arrangement is shown in FIGS. 8A-8C. In FIGS. 8A-8C, image sensor unit 15 (and, in particular, carrier 44) may include channels for cooling fluid (e.g., air, liquid, or other cooling fluids).

FIG. 8A shows a top view of a permanent carrier 44 that may include fluid cooling channels (channels for cooling fluid). As shown in FIG. 8A, permanent carrier 44 may include cavity 144, into which iCP 16 may be mounted (as shown in FIG. 7), and channels 142. Channels 142 may allow for cooling fluid to come into contact with iCP 16, and (optionally) portions of imager 14. The cooling fluid may be circulated in order to remove excess heat generated by iCP 16, imager 14, and other circuitry in image sensor unit 15. FIG. 8A also illustrates the locations along which the cross-sections of FIG. 8C and FIG. 8B are taken.

A cross-sectional side view taken along line 8B of FIG. 8A is shown in FIG. 8B. As shown in FIG. 8B, portions of PCB 130, permanent carrier 44, oxide 68, iCP 16, and imager 44 may all be contact with cooling fluid 140. In addition, PCB 130 may include fluid inlets and outlets such as inlet 136 and outlet 138. While FIG. 8A shows only a single pair on inlets and outputs, image sensor unit 15 may, in general, include any desired number of inlets and outputs, and need not include equal numbers of inlets and outlets.

PCB 130 may form the exterior walls of a cavity containing cooling fluid 140. Heated cooling fluid 140 may be expelled (or pulled out by external pumps) through outlet 138 and ingested (or pushed in by external pumps) through inlet 136. In this manner, heat generated by image sensor unit 15 during operation may be effectively dissipated. In at least some embodiments, cooling fluid 140 may be an insulator (such as air). In arrangements in which cooling fluid 140 is a conductor, conductive components of image sensor unit 15 that come into contact with cooling fluid 140 may be sealed with insulator (such as epoxy).

As shown in FIG. 8C, channels 142 in permanent carrier 44 may allow cooling fluid 140 to come into contact with peripheral regions of iCP 16 and the underside of imager 14 (through oxide layer 68, if oxide layer 68 is included). If desired, cooling fluid 140 may substantially surround the periphery of iCP 16. External cooling fins, radiators, or other structures along with pumps may be provided in order to complete a fluid cooling system. When the cooling fluid 140 is air, the fluid cooling system may be as simple as a single fan drawing air through the channels 142 in carrier 44.

Figure 9:
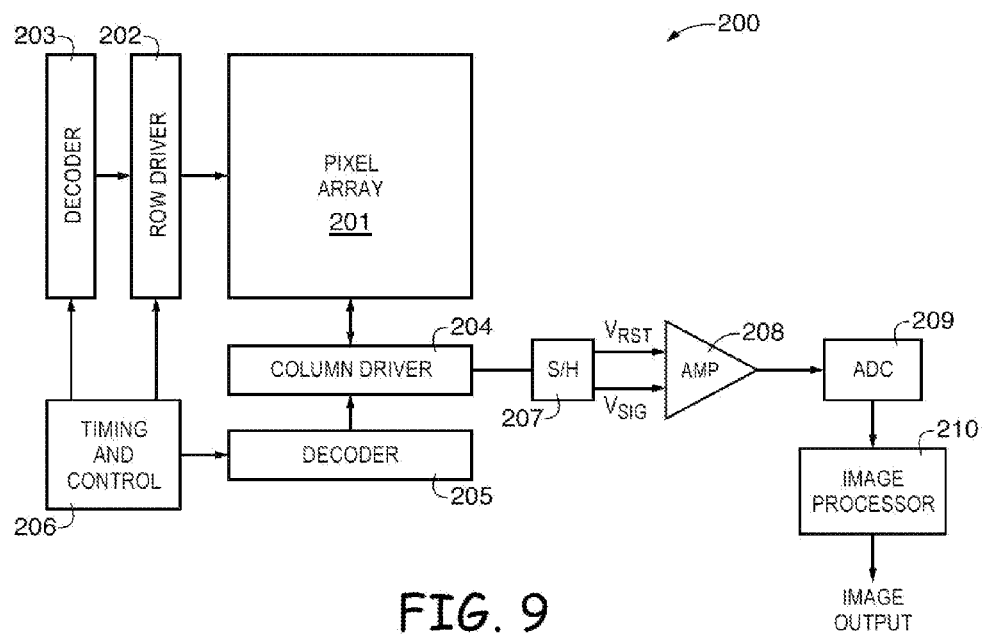
FIG. 9 is a block diagram of an imager employing one or more of the embodiments of FIGS. 1-8 in accordance with embodiments of the present invention.

FIG. 9 illustrates a simplified block diagram of imager 200 (e.g., an imager that may include stacked iCP 16 and imager 14 and that may include fluid cooling channels). Pixel array 201 includes a plurality of pixels containing respective photosensors arranged in a predetermined number of columns and rows. The row lines are selectively activated by row driver 202 in response to row address decoder 203 and the column select lines are selectively activated by column driver 204 in response to column address decoder 205. Thus, a row and column address is provided for each pixel.

CMOS imager 200 is operated by a timing and control circuit 206, which controls decoders 203, 205 for selecting the appropriate row and column lines for pixel readout, and row and column driver circuitry 202, 204, which apply driving voltages to the drive transistors of the selected row and column lines. The pixel signals, which typically include a pixel reset signal Vrst and a pixel image signal Vsig for each pixel are sampled by sample and hold circuitry 207 associated with the column driver 204. A differential signal Vrst-Vsig is produced for each pixel, which is amplified by amplifier 208 and digitized by analog-to-digital converter 209. The analog to digital converter 209 converts the analog pixel signals to digital signals, which are fed to image processor 210 which forms a digital image.

Figure 10:
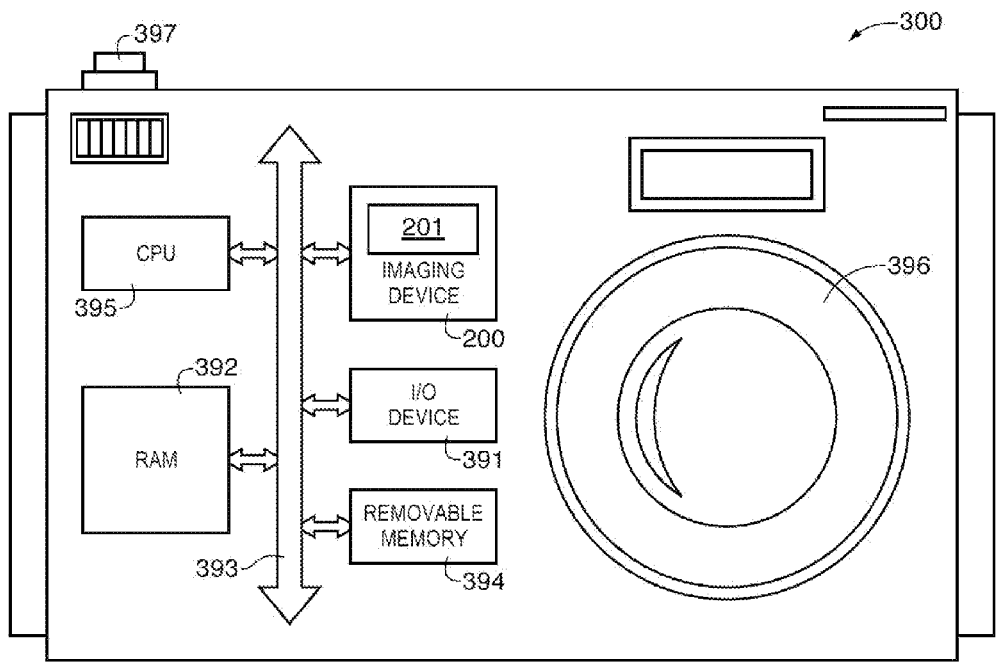
FIG. 10 is a block diagram of a processor system employing the imager of FIG. 9 in accordance with embodiments of the present invention.

FIG. 10 shows in simplified form a typical processor system 300, such as a digital camera, which includes an imaging device such as imaging device 200 (e.g., an imager that may include stacked iCP 16 and imager 14 and that may include fluid cooling channels). Processor system 300 is exemplary of a system having digital circuits that could include imaging device 200. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating image sensor units. Each image sensor unit may include an imager and an image co-processor (iCP) stacked together. In addition, a permanent carrier in each image sensor unit, or another suitable structure, may form fluid cooling channels. Cooling fluid that passes through the cooling channels may serve to draw excess heat away from the iCP, the imager, and other heat-generating circuitry in each image sensor unit.

The foregoing is merely illustrative of the principles of this invention which can be practiced in other embodiments.

What is claimed is:

1. An image sensor unit, comprising:
    a backside illuminated imager that contains an array of image pixels, wherein the imager integrated circuit has a front surface on which the array of image pixels is formed and a rear surface through which incident light enters the imager;
    an image co-processor stacked together with the backside illuminated imager;
    a permanent carrier affixed to the imager, wherein the permanent carrier has portions that define a cavity and has channels that pass between the cavity and peripheral regions of the permanent carrier, wherein the image co-processor is disposed in the cavity; and
    a printed circuit board on which the permanent carrier is mounted, wherein the printed circuit board has at least one fluid inlet and at least one fluid outlet through which cooling fluid passes, wherein the inlet, outlet, and the channels are configured to receive the cooling fluid through the inlet; pass the cooling fluid through at least a first one of the channels, past the image co-processor such that the cooling fluid absorbs heat from the image co-processor, and through at least a second one of the channels; and expel the cooling fluid through the outlet.

2. The image sensor unit defined in claim 1 wherein the front surface of the backside illuminated imager is affixed to the permanent carrier.

3. The image sensor unit defined in claim 2 wherein the image co-processor comprises a front side and circuitry on the front side and wherein the front side of the image co-processor is affixed to the permanent carrier.

4. The image sensor unit defined in claim 3 wherein the permanent carrier and the backside illuminated imager each comprise through-silicon vias and redistribution layers, wherein the backside illuminated imager comprises a first plurality of backside bond pads located on the rear surface, and wherein the image co-processor comprises metal contacts that are coupled to the first plurality of backside bond pads through the through-silicon vias and the redistribution layers of both the permanent carrier and the backside illuminated imager.

5. The image sensor unit defined in claim 4 wherein the backside illuminated imager comprises a second plurality of backside bond pads located on the rear surface and wherein the imager comprises frontside bond pads located on the front surface and wherein the frontside bond pads of the imager are coupled to the backside bond pads through the through-silicon vias in the backside illuminated imager.

6. The image sensor unit defined in claim 3 wherein the image co-processor comprises a front side, a backside, and circuitry disposed on the front side and wherein the back side of the image co-processor is affixed to the permanent carrier.

7. The image sensor unit defined in claim 6 further comprising:
at least one photodefinable layer that covers the image co-processor.

8. The image sensor unit defined in claim 7 wherein the permanent carrier, the backside illuminated imager, and the at least one photodefinable layer each comprise through-silicon vias and redistribution layers, wherein the backside illuminated imager comprises a first plurality of backside bond pads located on the rear surface, and wherein the image co-processor comprises metal contacts that are coupled to the first plurality of backside bond pads through the through-silicon vias and the redistribution layers of each of the photodefinable layer, the permanent carrier, and the backside illuminated imager.

9. An image sensor unit, comprising:
an imager that contains an array of image pixels;
a permanent carrier affixed to the imager, wherein the permanent carrier has portions that define a cavity and has channels that pass between the cavity and peripheral regions of the permanent carrier;
an image co-processor disposed in the cavity; and
a printed circuit board on which the permanent carrier is mounted, wherein the printed circuit board has at least one fluid inlet and at least one fluid outlet through which cooling fluid passes, wherein the inlet, outlet, and the channels are configured to receive the cooling fluid through the inlet; pass the cooling fluid through at least a first one of the channels, past the image co-processor such that the cooling fluid absorbs heat from the image co-processor, and through at least a second one of the channels; and expel the cooling fluid through the outlet.

10. The image sensor unit defined in claim 9 wherein the cooling fluid comprises air.

11. The image sensor unit defined in claim 9 wherein the cooling fluid comprises liquid.

12. The image sensor unit defined in claim 11 further comprising:
an interposed disposed above the imager; and
at least one lens mounted to the interposer.

13. The image sensor unit defined in claim 12 wherein the imager comprises a backside illuminated imager.

14. A system, comprising:
a central processing unit;
memory;
input-output circuitry; and
an imaging device that includes:
an imager that contains an array of image pixels;
a permanent carrier affixed to the imager, wherein the permanent carrier has portions that define a cavity and has channels that pass between the cavity and peripheral regions of the permanent carrier;
an image co-processor disposed in the cavity; and
a printed circuit board on which the permanent carrier is mounted, wherein the printed circuit board has at least one fluid inlet and at least one fluid outlet through which cooling fluid passes, wherein the inlet, outlet, and the channels are configured to receive the cooling fluid through the inlet; pass the cooling fluid through at least a first one of the channels, past the image co-processor such that the cooling fluid absorbs heat from the image co-processor, and through at least a second one of the channels; and expel the cooling fluid through the outlet.

15. The system defined in claim 14 wherein the imager comprises a backside illuminated imager.

16. The system defined in claim 15 wherein the cooling fluid comprises cooling liquid.

17. The system defined in claim 16 further comprising epoxy that prevents the cooling liquid from coming into direct contact with the image co-processor.

* * * * *